(12) United States Patent
Chou et al.

(10) Patent No.: US 11,955,522 B2
(45) Date of Patent: Apr. 9, 2024

(54) SEMICONDUCTOR STRUCTURE AND METHOD OF FORMING THE SAME

(71) Applicant: Vanguard International Semiconductor Corporation, Hsinchu (TW)

(72) Inventors: Cheng-Wei Chou, Taoyuan (TW); Shin-Cheng Lin, Tainan (TW); Yung-Fong Lin, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 34 days.

(21) Appl. No.: 16/789,682

(22) Filed: Feb. 13, 2020

(65) Prior Publication Data
US 2021/0257467 A1 Aug. 19, 2021

(51) Int. Cl.
| | |
|---|---|
| *H01L 29/778* | (2006.01) |
| *H01L 21/02* | (2006.01) |
| *H01L 21/285* | (2006.01) |
| *H01L 23/29* | (2006.01) |
| *H01L 23/31* | (2006.01) |
| *H01L 29/20* | (2006.01) |
| *H01L 29/205* | (2006.01) |
| *H01L 29/40* | (2006.01) |

(Continued)

(52) U.S. Cl.
CPC ........ *H01L 29/408* (2013.01); *H01L 21/0217* (2013.01); *H01L 21/02186* (2013.01); *H01L 21/28575* (2013.01); *H01L 23/291* (2013.01); *H01L 23/3192* (2013.01); *H01L 29/2003* (2013.01); *H01L 29/205* (2013.01); *H01L 29/452* (2013.01); *H01L 29/66462* (2013.01); *H01L 29/7786* (2013.01); *H01L 29/7787* (2013.01)

(58) Field of Classification Search
CPC ............ H01L 29/7786; H01L 29/7787; H01L 29/7781–7785; H01L 29/66462
See application file for complete search history.

(56) References Cited

U.S. PATENT DOCUMENTS

| | | | |
|---|---|---|---|
| 9,722,063 B1* | 8/2017 | Kudymov | ........... H01L 29/2003 |
| 2014/0001640 A1* | 1/2014 | Nishizawa | ........... H01L 29/417 |
| | | | 257/773 |

(Continued)

OTHER PUBLICATIONS

Jie, H. "◆◆ g = 100 nm T-shaped gate AlGaN/GaN HEMTs on Si substrates with non-planar source/drain regrowth of highly-doped n+-GaN layer by MOCVD" Chin. Phys. B vol. 23, No. 12 Dec. 2014 p. 128102-1 through 128102-5 (Year: 2014).*

(Continued)

*Primary Examiner* — Grant S Withers
(74) *Attorney, Agent, or Firm* — Birch, Stewart, Kolasch & Birch, LLP

(57) ABSTRACT

A semiconductor structure is provided. The semiconductor structure includes a substrate, a buffer layer, a barrier layer, a dielectric layer, a source structure, and a drain structure. The buffer layer is disposed on the substrate. The barrier layer is disposed on the buffer layer. The dielectric layer is disposed on the barrier layer. The passivation layer is disposed on the dielectric layer. The source structure and the drain structure are disposed on the passivation layer.

12 Claims, 6 Drawing Sheets

(51) Int. Cl.
*H01L 29/45* (2006.01)
*H01L 29/66* (2006.01)

(56) References Cited

U.S. PATENT DOCUMENTS

| | | | |
|---|---|---|---|
| 2015/0061038 A1* | 3/2015 | Takewaki | H01L 29/408 |
| | | | 257/401 |
| 2015/0081167 A1 | 3/2015 | Pisz et al. | |
| 2015/0349117 A1* | 12/2015 | Chu | H01L 29/66462 |
| | | | 257/66 |
| 2016/0020207 A1* | 1/2016 | Tsuchiya | H01L 29/41758 |
| | | | 257/401 |
| 2016/0308002 A1 | 10/2016 | Yang et al. | |
| 2017/0047437 A1* | 2/2017 | Nakayama | H01L 21/2258 |
| 2017/0133496 A1* | 5/2017 | Tsai | H01L 21/765 |
| 2018/0158909 A1* | 6/2018 | Mishra | H01L 29/41766 |
| 2018/0197856 A1 | 7/2018 | Chou et al. | |
| 2018/0294161 A1 | 10/2018 | Shen et al. | |
| 2020/0144386 A1* | 5/2020 | Kanda | H01L 29/0843 |

OTHER PUBLICATIONS

Taiwanese Office Action and Search Report dated Jun. 12, 2020 for Application No. 108142228. .

* cited by examiner

SEMICONDUCTOR STRUCTURE AND METHOD OF FORMING THE SAME

BACKGROUND OF THE INVENTION

Field of the Invention

The present invention is related to a semiconductor structure, and in particular it is related to a high electron mobility transistor (HEMT).

Description of the Related Art

High electron mobility transistors (HEMT) are widely used in high-power semiconductor devices due to their having such advantages as a high breakdown voltage and high output voltage.

The GaN material has been actively developed for application in radio frequency and power because it has wide band gaps and high-speed electrons. The on-resistance of a GaN HEMT is mainly determined by the two-dimensional electron gas channel and the heterojunction between the source and the drain and GaN. The heterojunction between the source and drain and GaN is extremely high. Therefore, a part of the source metal and the drain metal usually diffuses into the two-dimensional electron gas channel by a heating process, thereby forming a good ohmic contact.

However, the materials of the source and the drain also diffuse into the oxide layer. Because silicon has a solid solubility against some materials, such as aluminum, at about 400° C., when the processing temperature is higher than 400° C., aluminum will diffuse to the surface of silicon, and silicon will enter aluminum via the diffusion effect, and aluminum will also fill the void left by the silicon due to the diffusion effect. Therefore, where the aluminum contacts the silicon, the so-called spiking phenomenon will take place, causing the source and the drain to generate an unwanted electrical connection to the gate, resulting in a short circuit.

Although existing high electron mobility transistors substantially reduce the spiking problem, they are not satisfactory in all respects. Therefore, there is still a need for a novel high electron mobility transistor to meet various needs.

BRIEF SUMMARY OF THE INVENTION

According to some embodiments of the present invention, a semiconductor structure is provided. The semiconductor structure includes a substrate, a buffer layer, a barrier layer, a dielectric layer, a protection layer and a source structure and a drain structure. The buffer layer is disposed on the substrate. The barrier layer is disposed on the buffer layer. The dielectric layer is disposed on the barrier layer. The protection layer is disposed on the dielectric layer. The source structure and the drain structure are disposed on the protection layer.

According to some embodiments of the present invention, a method of forming a semiconductor structure is provided. The method includes: providing a substrate; forming a buffer layer on the substrate; forming a barrier layer on the buffer layer; forming a dielectric layer on the barrier layer; forming a protection layer on the dielectric layer; and forming a source structure and a drain structure on the protection layer.

A detailed description is given in the following embodiments with reference to the accompanying drawings.

BRIEF DESCRIPTION OF THE DRAWINGS

The embodiments of the present invention will be described in detail below with reference made to the accompanying drawings. It should be noted that, in accordance with standard practice in the industry, the various features are not drawn to scale and are merely illustrative. In fact, the dimensions of the elements may be arbitrarily enlarged or reduced to clearly show the features of the embodiments of the present invention.

DETAILED DESCRIPTION OF THE INVENTION

Figure 1:
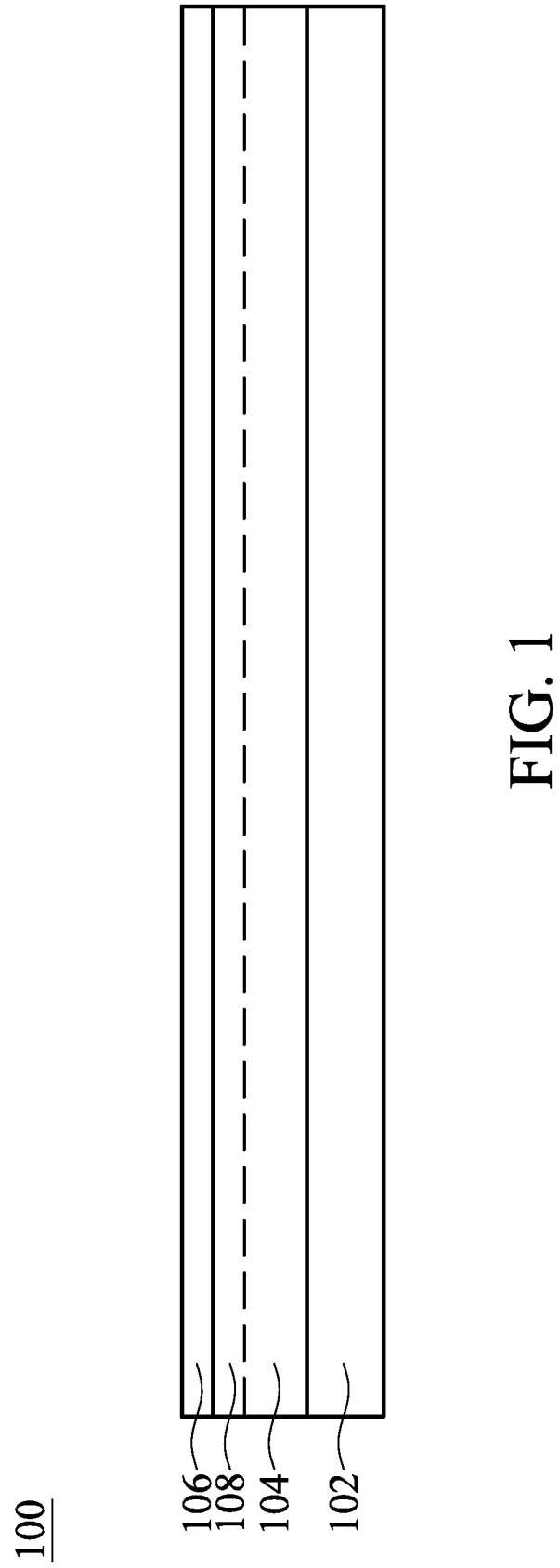
FIG. 1 is a cross-sectional view illustrating one stage of forming a semiconductor structure in accordance with some embodiments.

The following disclosure provides many different embodiments, or examples, for implementing different features of the invention. Specific examples of elements and arrangements are described below to illustrate the present invention. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present invention may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper," and the like, may be used herein to easily describe one element's or feature's relationship to another element(s) or feature(s) as illustrated in the figures. The spatially relative terms are intended to encompass different orientations of the device in use or operation, in addition to the orientation depicted in the figures. The apparatus may be otherwise oriented (e.g., rotated 90 degrees or at other orientations) and the spatially relative descriptors used herein may likewise be interpreted accordingly.

Herein, the terms "about", "approximately" and "substantially" typically mean +/−20% of the stated value or range, typically +/−10% of the stated value or range, typically +/−5% of the stated value or range, typically +/−3% of the stated value or range, typically +/−2% of the stated value or range, typically +/−1% of the stated value or range, and typically +/−0.5% of the stated value or range. It should be noted that the stated value of the present disclosure is an approximate value. Namely, the meaning of "about", "approximately" and "substantially" may be implied if there is no specific description of "about", "around" and "substantially".

It should be understood that although the terms "first", "second", "third" etc. may be used herein to describe various elements, components, regions, layers, and/or portions, these elements, components, regions, layers, and/or portions should not be limited by these terms. These terms are only used to distinguish one element, component, region, layer, and/or portion from another element, component, region, layer and/or portion. Thus, a first element, component, region, layer, and/or portion discussed below could be termed a second element, component, region, layer, and/or portion without departing from the teachings of the present disclosure.

Although the steps in some of the described embodiments are performed in a particular order, these steps can also be performed in other logical orders. In various embodiments, some of the described steps may be replaced or omitted, and some other operations may be performed before, during, and/or after the steps described in the embodiments of the present invention. The high electron mobility transistor in the embodiments of the invention may incorporate other features. Some features may be replaced or omitted in different embodiments.

Elements or layers with similar names may be formed using similar materials or methods unless otherwise stated.

The embodiments of the present invention provide a semiconductor structure and a method of forming the same. By disposing a protection layer between the source structure and the dielectric layer and between the drain structure and the dielectric layer, when a heating process is performed to form an ohmic contact, the conductive materials of the source structure and the drain structure can be prevented from diffusing to the dielectric layer, thereby avoiding a short circuit between the source structure and the drain structure and the gate structure.

FIGS. 1 to 5 are cross-sectional views illustrating various stages of forming a semiconductor structure 100 in accordance with some embodiments. As shown in FIG. 1, a substrate 102 is provided. In some embodiments, the substrate 102 may be an $Al_2O_3$ (sapphire) substrate. Moreover, the substrate 102 may be a semiconductor substrate. The semiconductor substrate may also be elementary semiconductors including silicon (Si) or germanium (Ge); compound semiconductors including gallium nitride (GaN), silicon carbide (SiC), gallium arsenide (GaAs), gallium phosphide (GaP), indium phosphide (InP), indium arsenide (InAs) and/or indium antimonide (InSb); alloy semiconductors including SiGe, GaAsP, AlInAs, AlGaAs, GaInAs, GaInP and/or (GaInAsP) or a combination thereof. In some embodiments, the substrate 102 may be a single crystal substrate, a multi-layer substrate, a gradient substrate, other suitable substrates, or a combination thereof. Moreover, the substrate 102 may also be a semiconductor on insulator (SOI) substrate. The SOI substrate may include a base plate, a buried oxide (BOX) layer disposed on the base plate, or a semiconductor layer disposed on the buried oxide layer.

Next, a buffer layer 104 is formed on the substrate 102. In some embodiments, the buffer layer 104 includes a III-V semiconductor such as GaN. The buffer layer 104 may also include AlGaN, AlN, GaAs, GaInP, AlGaAs, InP, InAlAs, InGaAs, other suitable III-V semiconductor materials, or a combination thereof. In some embodiments, the buffer layer 104 may be formed on the substrate 102 by molecular-beam epitaxy (MBE), hydride vapor phase epitaxy (HVPE), metalorganic chemical vapor deposition (MOCVD), chemical vapor deposition (CVD), atomic layer deposition (ALD), physical vapor deposition (PVD), molecular beam deposition (MBD), plasma enhanced chemical vapor deposition (PECVD), other suitable methods, or a combination thereof.

Next, a barrier layer 106 is formed on the buffer layer 104. In some embodiments, the barrier layer 106 includes a different material than that of the buffer layer 104. The barrier layer 106 may include III-V semiconductors such as $Al_xGa_{1-x}N$, where 0<x<1. The barrier layer 106 may also include GaN, AlN, GaAs, GaInP, AlGaAs, InP, InAlAs, InGaAs, other suitable III-V materials, or a combination thereof. In some embodiments, the barrier layer 106 may be formed on the buffer layer 104 by molecular-beam epitaxy, hydride vapor phase epitaxy, metalorganic chemical vapor deposition, chemical vapor deposition, atomic layer deposition, physical vapor deposition, molecular beam deposition, plasma enhanced chemical vapor deposition, other suitable methods, or a combination thereof.

Since the materials of the buffer layer 104 and the barrier layer 106 are different, the band gaps are different, and a heterojunction is formed at the interface between the buffer layer 104 and the barrier layer 106. The band bends at the heterojunction, and a quantum well is formed at the deep of the conduction band. The electrons produced by piezoelectricity are confined in the quantum well. Therefore, a two-dimensional electron gas (2 DEG) is formed at the interface between the buffer layer 104 and the barrier layer 106, and a conducting current is formed. As shown in FIG. 1, a channel region 108 is formed at the interface between the buffer layer 104 and the barrier layer 106. The channel region 108 is where the conducting current is formed by the two-dimensional electron gas (2 DEG).

Figure 2:
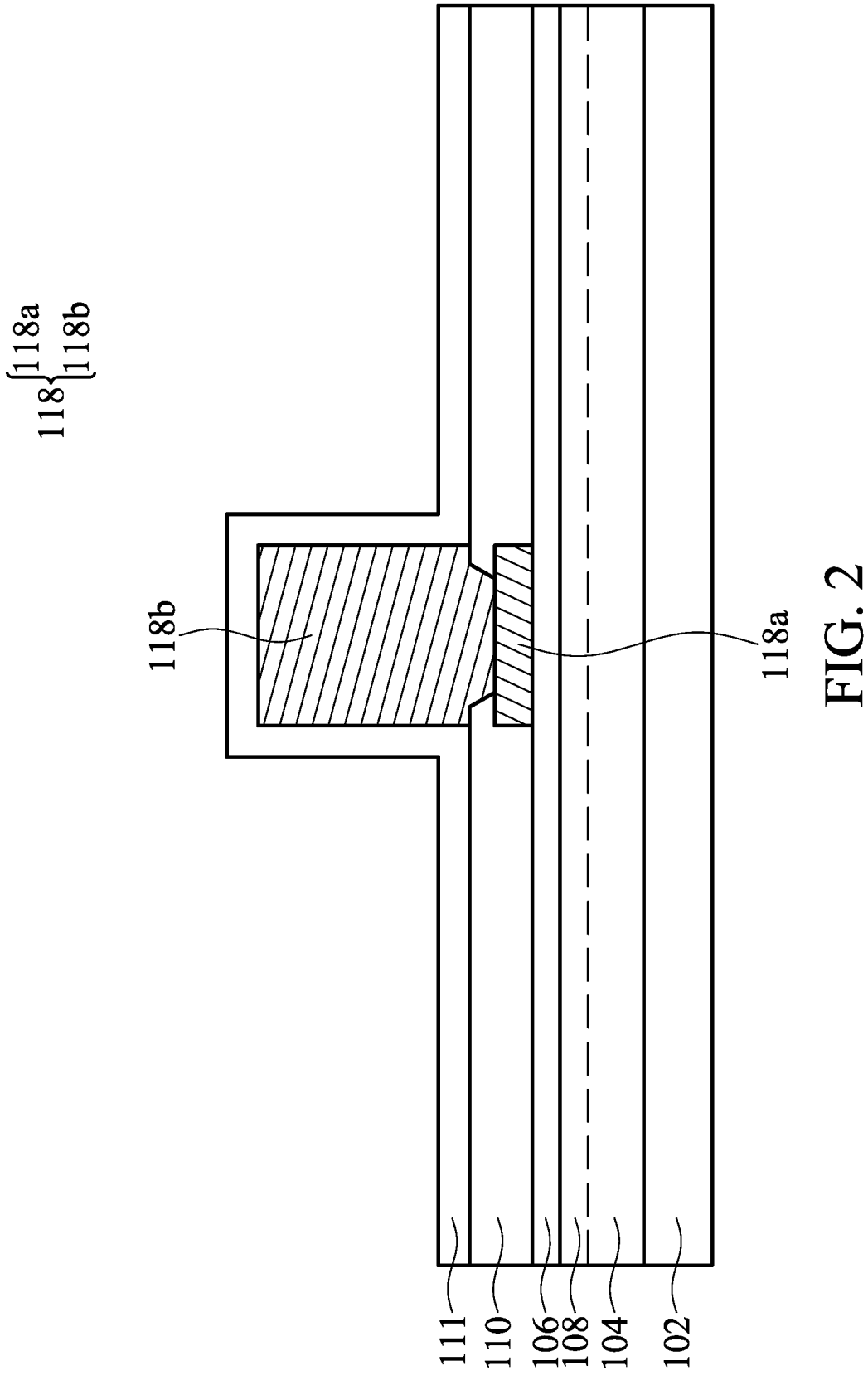
FIG. 2 is a cross-sectional view illustrating one stage of forming a semiconductor structure in accordance with some embodiments.

Next, referring to FIG. 2, a dielectric layer 110 is formed on the barrier layer 106. In some embodiments, the dielectric layer 110 includes $SiO_2$, $SiN_3$, SiON, $Al_2O_3$, MgO, $Sc_2O_3$, $HfO_2$, HfSiO, HfSiON, HfTaO, HfTiO, HfZrO, LaO, ZrO, $TiO_2$, $ZnO_2$, $ZrO_2$, $AlSiN_3$, SiC, or $Ta_2O_5$, other suitable dielectric materials, or a combination thereof. In some embodiments, the dielectric layer 110 may be formed on the barrier layer 106 by molecular-beam epitaxy, hydride vapor phase epitaxy, metalorganic chemical vapor deposition, chemical vapor deposition, atomic layer deposition, physical vapor deposition, molecular beam deposition, plasma enhanced chemical vapor deposition, other suitable methods, or a combination thereof.

Then, a protection layer 112 is formed on the dielectric layer 110. The protection layer 112 includes a high-temperature infusible material such as a material that does not melt at 550° C. to 1000° C., a material that does not melt at 650° C. to 1100° C., a material that does not melt at 750° C. to 1200° C., or a material that does not melt at 850° C. to 1300° C. For example, the material of the protection layer 112 includes TiN, SiN, the like or a combination thereof. In some embodiments, the protection layer 112 may be formed on the dielectric layer 110 by molecular-beam epitaxy, hydride vapor phase epitaxy, metalorganic chemical vapor deposition, chemical vapor deposition, atomic layer deposition, physical vapor deposition, molecular beam deposition, plasma enhanced chemical vapor deposition, other suitable methods, or a combination thereof. In some embodiments, the protection layer 112 may be a multilayer structure. For example, the protection layer 112 includes a high-temperature infusible material layer 112a and a passivation layer 112b on the high-temperature infusible material layer 112a. Since the high-temperature infusible material layer 112a may be damaged by subsequent processes, such as photoresist removal and surface cleaning processes, the passivation layer 112b can prevent the high-temperature infusible material layer 112a from being damaged by subsequent processes.

Figure 3:
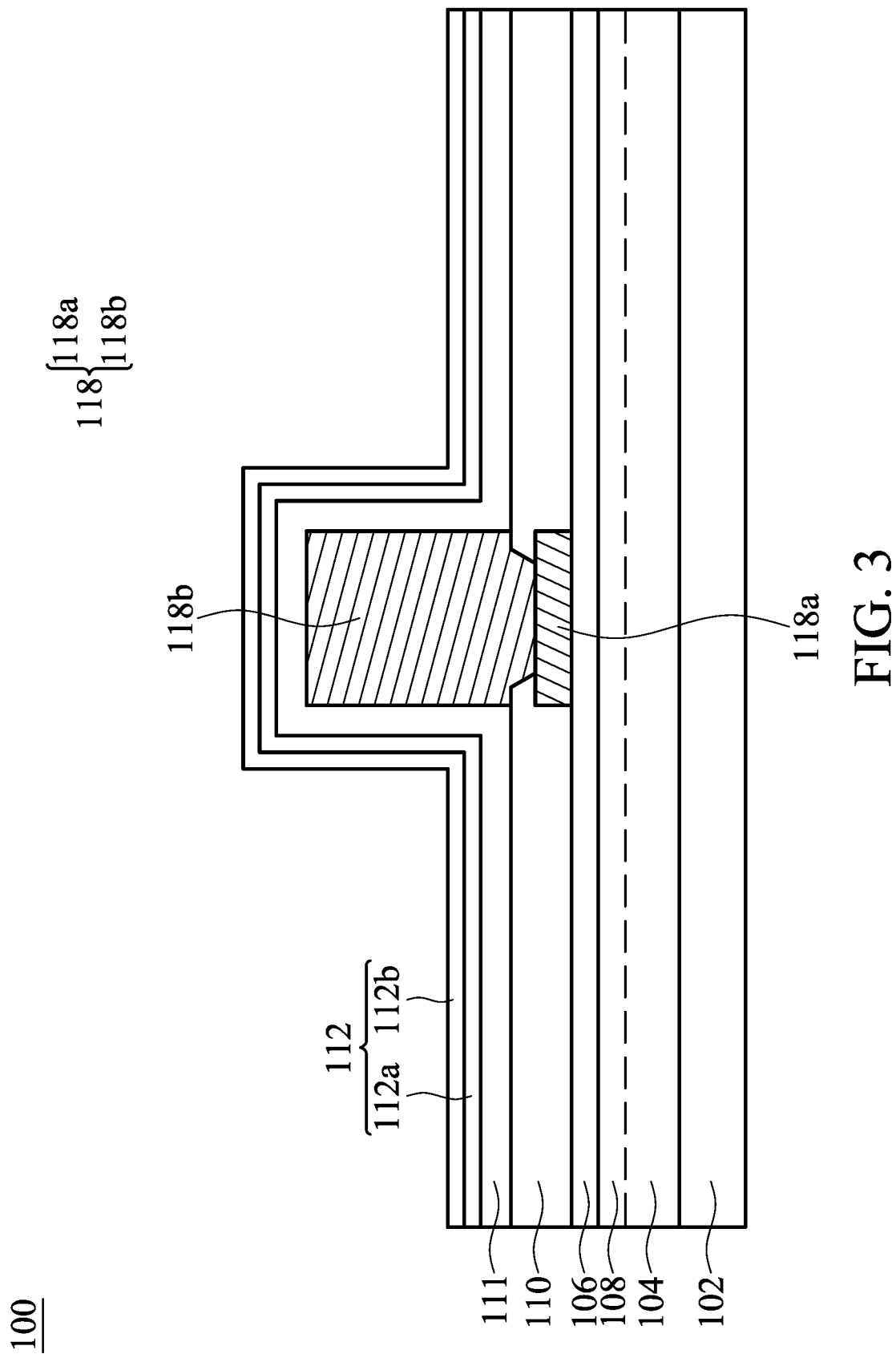
FIG. 3 is a cross-sectional view illustrating one stage of forming a semiconductor structure in accordance with some embodiments.

Next, referring to FIG. 3, an opening 114 is formed through the protection layer 112, the dielectric layer 110, the barrier layer 106 and a portion of the buffer layer 104. To be specific, a photoresist material is formed on the top surface of the protection layer 112 by a suitable process such as spin coating or chemical vapor deposition, atomic layer deposition, physical vapor deposition, molecular beam deposition, plasma enhanced chemical vapor deposition, other appropriate methods, or other suitable depositions or a combination thereof, and then optical exposure, post-exposure baking and development are performed to remove a portion of the photoresist material to form a patterned photoresist layer, and the patterned photoresist layer will serve as an etching mask for etching. A bi- or tri-layer photoresist can be performed. Then, the protection layer 112, the dielectric layer 110, the barrier layer 106 and a portion of the buffer layer 104 can be etched using any acceptable etching process, such as reactive ion etching, neutral beam etching, the like, or a combination thereof. It should be understood that the opening 114 may or may not pass through the channel region 108 according to actual needs. Although the cross-sectional shape of the opening is rectangle, it should be understood that the cross-sectional shape of the opening is merely for illustrative purpose and is not intended to limit the present invention.

Figure 4:
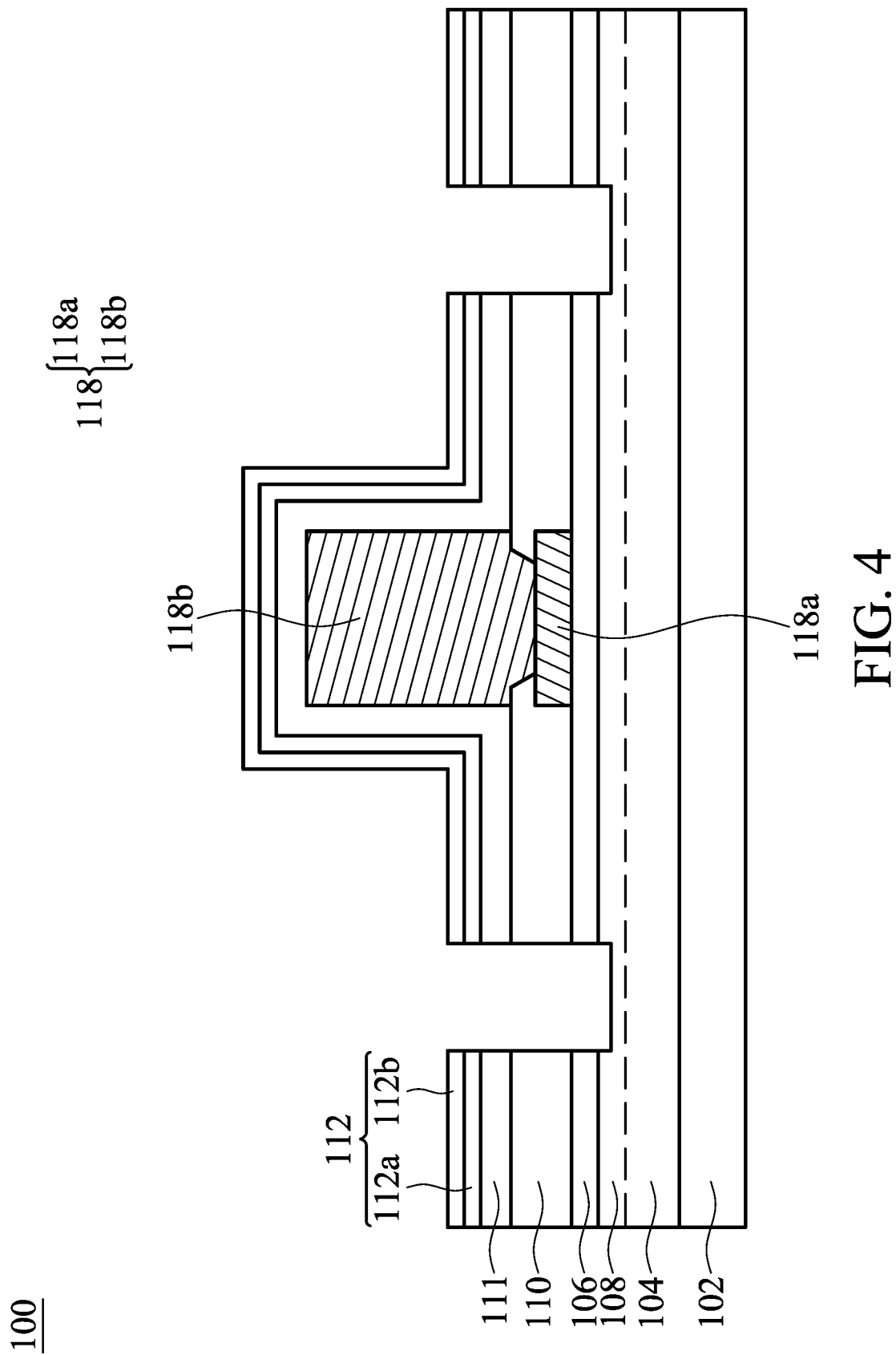
FIG. 4 is a cross-sectional view illustrating one stage of forming a semiconductor structure in accordance with some embodiments.

Next, referring to FIG. 4, a conductive material layer 116 is formed on the protection layer 112. In some embodiments, the material of the conductive material layer 116 includes polycrystalline silicon, a metal (such as tungsten, titanium, aluminum, copper, molybdenum, nickel, platinum, the like, or a combination thereof), a metal alloy, a metal nitride (such as tungsten nitride, molybdenum nitride, titanium nitride, tantalum nitride, the like or a combination thereof), metal silicides (e.g. tungsten silicide, titanium silicide, cobalt silicide, nickel silicide, platinum silicide, erbium silicide, the like, or a combination thereof), metal oxides (ruthenium oxide, indium tin oxide, the like, or a combination thereof), other applicable conductive materials, or a combination thereof. In a specific embodiment, the material of the conductive material layer 116 includes titanium, aluminum, or a combination thereof. In some embodiments, the conductive material layer 116 may be formed on the protection layer 112 by molecular-beam epitaxy, hydride vapor phase epitaxy, metalorganic chemical vapor deposition, chemical vapor deposition, atomic layer deposition, physical vapor deposition, molecular beam deposition, plasma enhanced chemical vapor deposition, other suitable methods, or a combination thereof. In some embodiments, the conductive material layer 116 is a multilayer structure (not shown).

Figure 5:
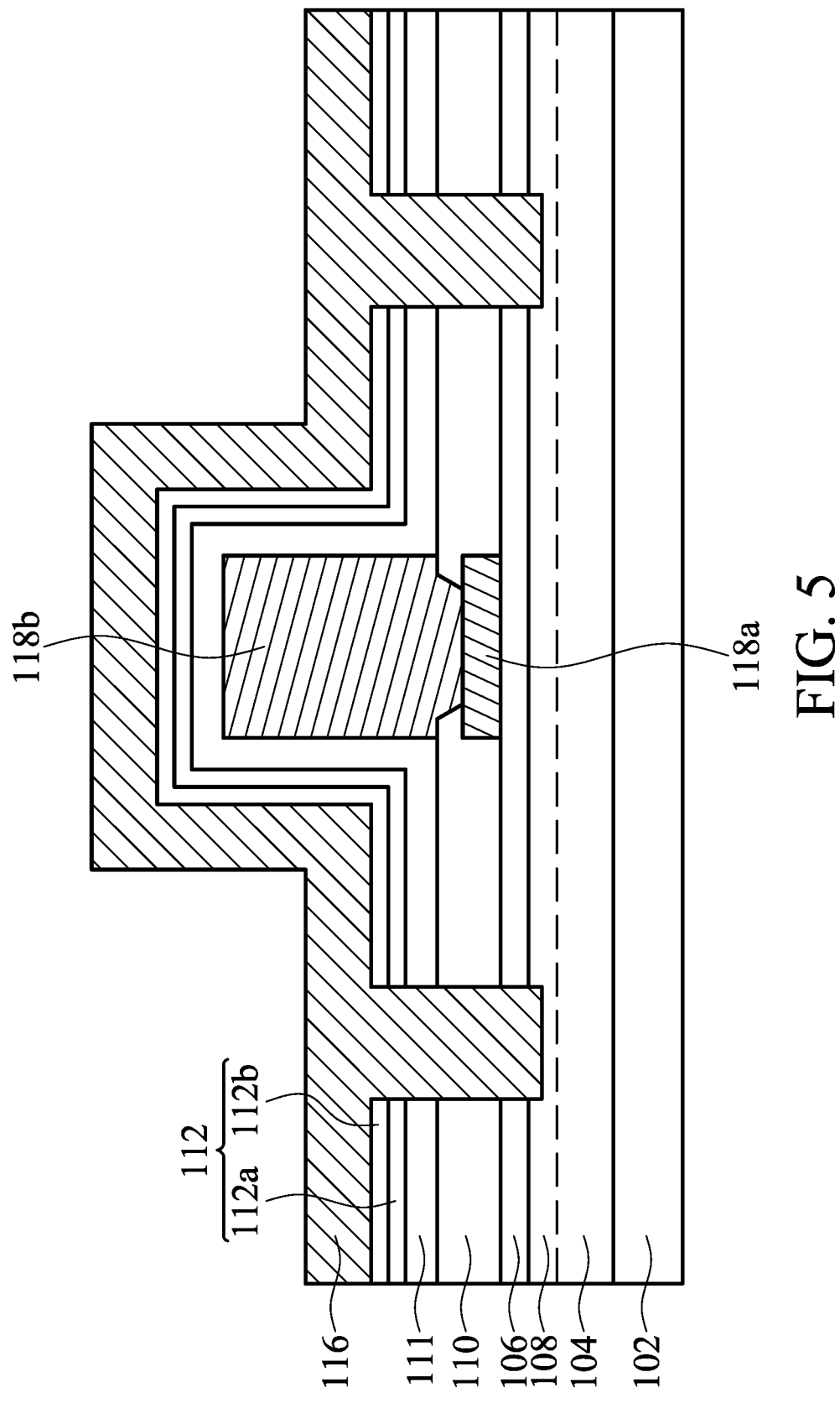
FIG. 5 is a cross-sectional view illustrating one stage of forming a semiconductor structure in accordance with some embodiments.

Next, referring to FIG. 5, the conductive material layer 116 and the protection layer 112 is patterned to form a source structure 116S and a drain structure 116D and a protection layer 112'. In some embodiments, the protection layer 112' includes a high-temperature infusible material layer 112a' and a passivation layer 112b' on the high-temperature infusible material layer 112a'. To be specific, a photoresist material is formed on the top surface of the conductive material layer 116 by a suitable process such as spin coating or chemical vapor deposition, atomic layer deposition, physical vapor deposition, molecular beam deposition, plasma enhanced chemical vapor deposition, other appropriate methods, or other suitable depositions or a combination thereof, and then optical exposure, post-exposure baking and development are performed to remove a portion of the photoresist material to form a patterned photoresist layer, and the patterned photoresist layer will serve as an etching mask for etching. A bi- or tri-layer photoresist can be performed. Then, the exposed portions of the conductive material layer 116 and the protection layer 112 can be etched using any acceptable etching process, such as reactive ion etching, neutral beam etching, the like, or a combination thereof.

The source structure 116S has an upper portion outside the opening 114 and a lower portion inside the opening 114. The upper portion of the source structure 116S has sidewalls aligned with the sidewalls of the protection layer 112'. In some embodiments, the sidewall of the protection layer 112' may extend beyond a sidewall of an upper portion of the source structure 116S. The lower portion of the source structure 116S is in direct contact with the buffer layer 104.

The drain structure 116D has an upper portion outside the opening 114 and a lower portion inside the opening 114. The upper portion of the drain structure 116D has sidewalls aligned with the sidewalls of the protection layer 112'. In some embodiments, the sidewall of the protection layer 112' may extend beyond a sidewall of an upper portion of the drain structure 116D. The lower portion of the drain structure 116D is in direct contact with the buffer layer 104.

Then, an ohmic contact is formed among the source structure 116S, the drain structure 116D, and the channel region 108 by a heating process, such as a rapid thermal annealing process.

Since the protection layer is disposed between the upper portion of the source structure and the dielectric layer and between the upper portion of the drain structure and the dielectric layer, the conductive materials of the source structure and the drain structure can be prevented from diffusing to the dielectric layer when an ohmic contact is formed, thereby avoiding a short circuit between the source structure and the drain structure and other layer structures.

In addition, in order to form a good ohmic contact, the source structure and the drain structure usually have a fixed thickness ratio and a stacked structure of materials. The protection layer is able to not affect the stacked structure of the source structure and the drain structure to maintain a fixed thickness ratio and material, and can prevent the conductive materials of the source structure and the drain structure from diffusing into the dielectric layer, thereby improving the process window.

Figure 6:
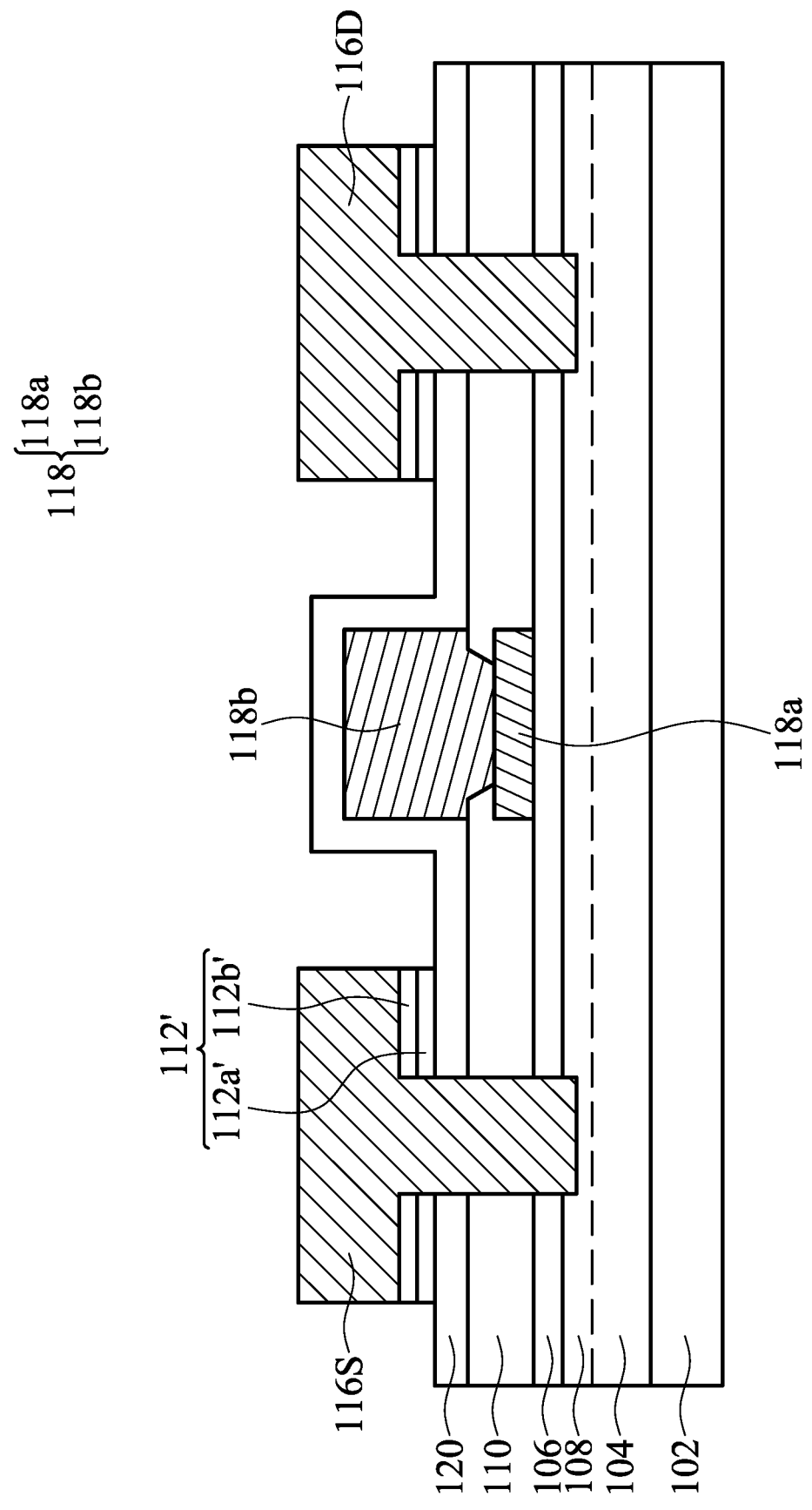
FIG. 6 is a cross-sectional view illustrating a semiconductor structure in accordance with some embodiments.

The semiconductor structure 100 may include other elements. For example, as shown in FIG. 6, the semiconductor structure 100 may include a gate structure 118 between the source structure 116S and the drain structure 116D; and a dielectric layer 120 between the protection layer 112' and the dielectric layer 110 and on the gate structure 118.

The gate structure 118 includes a gate layer 118a and a gate electrode layer 118b on the gate layer 118a. In some embodiments, the gate layer 118a may include GaN, AN, GaAs, GaInP, AlGaAs, InP, InAlAs, InGaAs, MgGaN, other suitable doped III-V materials, or a combination thereof. In a specific embodiment, the gate layer 118a includes MgGaN. In some embodiments, the material of the gate electrode layer 118b includes polycrystalline silicon, a metal (such as tungsten, titanium, aluminum, copper, molybdenum, nickel, platinum, the like, or a combination thereof), a metal alloy, a metal nitride (such as tungsten nitride, molybdenum nitride, titanium nitride, tantalum nitride, the like or a combination thereof), metal silicides (e.g. tungsten silicide, titanium silicide, cobalt silicide, nickel silicide, platinum silicide, erbium silicide, the like, or a combination thereof), metal oxides (ruthenium oxide, indium tin oxide, the like, or a combination thereof), other applicable conductive materials, or a combination thereof. In a specific embodiment, the material of the gate electrode layer 118b includes a metal nitride, such as titanium nitride (TiN). In some embodiments, the dielectric layer 120 includes $SiO_2$, $SiN_3$, SiON, $Al_2O_3$, MgO, $Sc_2O_3$, $HfO_2$, HfSiO, HfSiON, HfTaO, HfTiO, HfZrO, LaO, ZrO, $TiO_2$, $ZnO_2$, $ZrO_2$, Al $SiN_3$, SiC, $Ta_2O_5$, other suitable dielectric materials, or a combination thereof.

Compared to the conventional technique, the embodiments of the present invention have one or more of the following advantages:

(1) By disposing the protection layer between the source structure and the dielectric layer and between the drain structure and the dielectric layer, the conductive materials of the source structure and the drain structure can be prevented from diffusing to the dielectric layer during the heating process of forming an ohmic contact, thereby avoiding short circuit between the source structure and the drain structure and other layer structures.

(2) In order to form a good ohmic contact, the source structure and the drain structure usually have a fixed thickness ratio and a stacked structure of materials. The protection layer is able to not affect the stacked structure of the source structure and the drain structure to maintain a fixed thickness ratio and material, and can prevent the conductive materials of the source structure and the drain structure from diffusing into the dielectric layer, thereby improving the process window.

(3) In addition, since the protection layer may further include the passivation layer, the high-temperature infusible material layer can be avoided from being damaged by subsequent processes, such as photoresist removal and surface cleaning processes.

Although some embodiments of the present invention and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and operations described in the specification. As one of ordinary skill in the art will readily appreciate from the disclosure of the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A semiconductor structure, comprising:
   a substrate;
   a buffer layer disposed on the substrate;
   a barrier layer disposed on the buffer layer;
   a dielectric layer disposed on the barrier layer;
   a protection layer disposed on the dielectric layer, wherein the protection layer is a multilayer structure, and wherein the protection layer comprises:
      a material layer, wherein the material layer comprises SiN; and
      a passivation layer disposed on the material layer; and
   a source structure and a drain structure both disposed directly above the protection layer, wherein sidewalls of the protection layer are aligned with uppermost-outermost opposing sidewalls of each of the source structure and the drain structure and aligned with lowermost-outermost opposing sidewalls of each of the source structure and the drain structure, and the protection layer is above the dielectric layer and below one of the source structure and the drain structure, and wherein the protection layer is solely under the source structure and the drain structure,
   wherein a vertical projection of an entirety of protrusions of the source structure and of protrusions of an entirety of the drain structure on the substrate and a vertical projection of an entirety of the protection layer on the substrate have a same entire projection area.

2. The semiconductor structure as claimed in claim 1, wherein the source structure and the drain structure are in direct contact with the buffer layer.

3. The semiconductor structure as claimed in claim 1, further comprising a gate structure disposed between the source structure and the drain structure.

4. The semiconductor structure as claimed in claim 3, wherein the gate structure comprises:
   a gate layer; and
   a gate electrode layer disposed on the gate layer.

5. The semiconductor structure as claimed in claim 4, wherein a material of the gate electrode layer comprises a metal nitride.

6. The semiconductor structure as claimed in claim 5, wherein the material of the gate electrode layer comprises titanium nitride.

7. A method of forming a semiconductor structure, comprising:
   providing a substrate;
   forming a buffer layer on the substrate;
   forming a barrier layer on the buffer layer;
   forming a dielectric layer on the barrier layer;
   forming a protection layer on the dielectric layer, wherein the protection layer is a multilayer structure, and wherein the protection layer comprises:
      a material layer, wherein the material layer comprises SiN; and
      a passivation layer disposed on the material layer; and
   forming a source structure and a drain structure both directly above the protection layer, wherein sidewalls of the protection layer are aligned with uppermost-outermost opposing sidewalls of each of the source structure and the drain structure and aligned with lowermost-outermost opposing sidewalls of each of the source structure and the drain structure, and the protection layer is above the dielectric layer and below one of the source structure and the drain structure, and wherein the protection layer is solely under the source structure and the drain structure,
   wherein a vertical projection of an entirety of protrusions of the source structure and of protrusions of an entirety of the drain structure on the substrate and a vertical projection of an entirety of the protection layer on the substrate have a same entire projection area.

8. The method of forming a semiconductor structure as claimed in claim 7, wherein the source structure and the drain structure are in direct contact with the buffer layer.

9. The method of forming a semiconductor structure as claimed in claim 7, further comprising forming a gate structure between the source structure and the drain structure.

10. The method as claimed in claim 9, wherein the gate structure comprises:
   a gate layer; and
   a gate electrode layer disposed on the gate layer.

11. The method as claimed in claim 10, wherein a material of the gate electrode layer comprises a metal nitride.

12. The method as claimed in claim 11, wherein the material of the gate electrode layer comprises titanium nitride.

* * * * *